United States Patent [19]
Pai et al.

[11] Patent Number: 5,466,540
[45] Date of Patent: Nov. 14, 1995

[54] MARK OF AN ELECTRONIC COMPONENT LID

[75] Inventors: Deepak K. Pai, Bloomington; Lowell D. Lund, Eden Prairie; Gene A. Maday, Spring Lake Park, all of Minn.

[73] Assignee: Ceridian Corporation, Bloomington, Minn.

[21] Appl. No.: 195,262

[22] Filed: Feb. 14, 1994

[51] Int. Cl.$^6$ .............................. B32B 5/14; B32B 15/00
[52] U.S. Cl. .......................... 428/614; 428/672; 428/941
[58] Field of Search .................................. 428/614, 594, 428/601, 941, 672; 148/512, 522; 205/120; 156/233, 240, 247

[56] References Cited

U.S. PATENT DOCUMENTS

| | | | |
|---|---|---|---|
| 221,231 | 11/1879 | Helgos | 428/614 |
| 1,116,803 | 11/1914 | Dainoff | 156/233 |
| 1,712,244 | 5/1929 | Bek et al. | 428/941 |
| 1,821,561 | 9/1931 | McFarland | 205/120 |
| 1,996,187 | 4/1935 | Barnhart | 205/120 |
| 2,770,586 | 11/1956 | Davis | 428/941 |
| 3,364,064 | 1/1968 | Wijburg | 428/672 |
| 3,503,815 | 3/1970 | Johnson | 428/614 |
| 4,495,255 | 1/1985 | Drapor et al. | 428/672 |
| 4,568,413 | 2/1986 | Toth et al. | 156/233 |
| 4,595,647 | 6/1986 | Spanjer | 430/138 |
| 4,902,364 | 2/1990 | Parker et al. | 156/233 |
| 5,008,997 | 4/1991 | Phy | 29/827 |
| 5,086,013 | 2/1992 | Shimizu et al. | 437/80 |
| 5,137,845 | 8/1992 | Lochon et al. | 437/183 |
| 5,158,860 | 10/1992 | Gulla et al. | 430/315 |
| 5,169,057 | 12/1992 | Blacka et al. | 228/205 |
| 5,190,486 | 3/1993 | Tsuk | 439/886 |

Primary Examiner—John Zimmerman
Attorney, Agent, or Firm—Kinney & Lange

[57] ABSTRACT

A method of combining a metal component and a base metal of an article to form a pattern of the article. The method comprises applying the metal component to a carrier, the metal component shaped like the pattern; placing the metal component against the base metal; and supplying heat such that the base metal and the metal component alloy.

4 Claims, 2 Drawing Sheets

MARK OF AN ELECTRONIC COMPONENT LID

BACKGROUND OF THE INVENTION

The present invention generally relates to a method of combining a base component and a base metal. Specifically, the present invention relates to a method of combining a metal component and a base metal of an article to form a pattern of the article, to a method of marking a metal coating, and to a method of marking a gold-plated lid of an electronic component. The present invention also relates to an article having a mark.

Most articles include one or more symbols, such as a mark. A mark may satisfy any of a wide variety of purposes, such as displaying or highlighting aesthetic value or communicating information about an article or device. For example, a mark may accent a feature of an article or may otherwise adorn an article. Also, a mark may identify an article, such as by part number, lot number, manufacturer, or date manufactured.

The Spanjer U.S. Pat. No. 4,595,647 discloses one method of marking an article. Specifically, the Spanjer patent describes a method of laser marking an electronic device that incorporates an improved material. The improved material is a plastic resin in which a filler material and a coloring material are mixed. The method includes coating the electronic device with the improved material and laser irradiating the improved material to change the color of the improved material.

Articles that are marked are sometimes coated with metal. The metal may provide a variety of desired qualities, such as abrasion resistance, improved appearance, corrosion protection, or increased strength. For example, electronic components are frequently plated with gold to minimize corrosion of underlying components. The gold plate may also ensure the electrical quality and reliability of circuitry located within the electronic components during extended periods of storage and use.

Several methods of marking metal coated articles are known. One method includes application of an epoxy-based compound to surfaces of metal coated articles. However, metal coated articles, such as electronic components used in military environments, are sometimes exposed to wide ranging environmental conditions that may include temperatures below −55° C. or above +100° C. Under such conditions, it has been found that epoxy-based compounds do not adequately adhere to some metal coated articles.

Another marking method involves laser etching of metal coated articles. However, laser etching is not entirely satisfactory. For instance, a laser beam may penetrate a metal coating under some conditions, such as when the metal coating is relatively thin. Penetrations in the metal coating may expose underlying metal or alloy to oxidizing environments that may corrode the underlying metal or alloy.

Another marking method involves attachment of a metal pattern to the surface of an article such that the pattern extends away from the article surface. Such metal pattern application is not always desirable since the pattern does not substantially conform to the profile of the article surface. A metal pattern that extends away from the article surface may be more easily damaged than a pattern that conforms to the profile of the article surface. Such a metal pattern may also damage items that the metal pattern contacts during use of the article.

Several techniques are disclosed for producing an article with a metal pattern. Many of these techniques include application and development of resist. For example, the Shimizu U.S. Pat. No. 5,086,013 discloses a method of placing a fine metal pattern on a substrate, such as a glass semiconductor device. Resist is applied to the substrate and silicon ions are implanted into select regions in an upper surface of the resist. The resist is irradiated with ultraviolet radiation using the implanted silicon regions as photomasks. Then, developed portions of the resist are removed using a solvent. Layers of conducting material, such as aluminum or gold, are next deposited onto the substrate and the remaining resist. The remaining resist is then removed using a solvent or plasma atmosphere to leave a desired conductor pattern on the substrate.

The Lochon U.S. Pat. No. 5,137,845 discloses a method of forming a metal contact terminal on a semi-conductor chip. The method involves placing a first mask on the chip and sequentially depositing distinct metal layers on the first mask and exposed portions of the chip. The first mask is removed and resist is then applied to the outermost metal layer and to exposed portions of the chip. A second mask is placed over the chip in alignment with the metal layers and the resist is exposed to ultraviolet light through the second mask. The developed portions of the resist and the second mask are removed, and the remaining resist pattern is used as a third mask while portions of the metal contact pad exposed by removing the developed resist are removed by etching. All remaining resist is then removed with a solvent to expose a finished metal contact terminal formed of the sequentially deposited metal layers.

The Gulla U.S. Pat. No. 5,158,860 discloses a process for selectively applying a metal pattern to the surface of a substrate. The method includes applying resist to the substrate, imaging the resist using a mask, and removing developed resist to create a desired image pattern on the substrate. The image pattern has recesses that are defined by side walls of the resist and by portions of the substrate exposed by removing developed resist. The surface layer of the remaining resist is imaged to form a surface imaged layer in the resist. Plating catalyst is then applied to the surface imaged layer and side walls of the resist and to exposed portions of the substrate. The surface imaged layer is then developed and removed to leave catalyzed surfaces solely in the recesses. Conductive metal is then deposited, using the plating catalyst, to fill the recesses and form the metal pattern. Remaining resist is imaged, developed, and removed to leave the metal pattern on the surface of the substrate.

The Tsuk U.S. Pat. No. 5,190,486 discloses an apparatus and a method for selectively plating end portions and a center portion of a conductive pen with gold and another conductive material, respectively. According to the method, end portions of the conductive pen are plated with gold. Resist is then placed on one of the end portions to mask a gold-plated region of the selected end portion. The center portion of the pen is then coated with tin-lead alloy by dipping the masked end portion and the center portion in a plating solution. The resist masking the end portion is then removed by immersion in an alkali stripping solution.

The Blacka et al. U.S. Pat. No. 5,169,057 discloses a method of soldering elements of an electronic component to an article having a gold-plated surface. First, a stream of metal particles is projected at the article at high velocity to remove gold plating from the surface of the article. Tin-containing solder is then applied to the surface cleaned of gold plate. According to Blacka et al., joining electronic component elements to a gold plated surface with tin-based solder causes embrittlement and ultimate failure of the gold-tin solder joint due to the interaction of the gold and tin. Blacka et al. provides an apparatus and method for selectively removing the gold plate to avoid the embrittlement and failure problem.

SUMMARY OF THE INVENTION

The present invention includes a method of combining a metal component and a base metal of an article to form a pattern of the article, with the method comprising applying the metal component to a carrier, the metal component shaped like the pattern; placing the metal component against the base metal; and supplying heat such that the base metal and the metal component alloy. The present invention also includes a method of marking a metal coating and a method of marking a gold-plated lid of an electronic component. The present invention further includes an article having a mark.

DETAILED DESCRIPTION OF THE PREFERRED EMBODIMENTS

Figure 1:
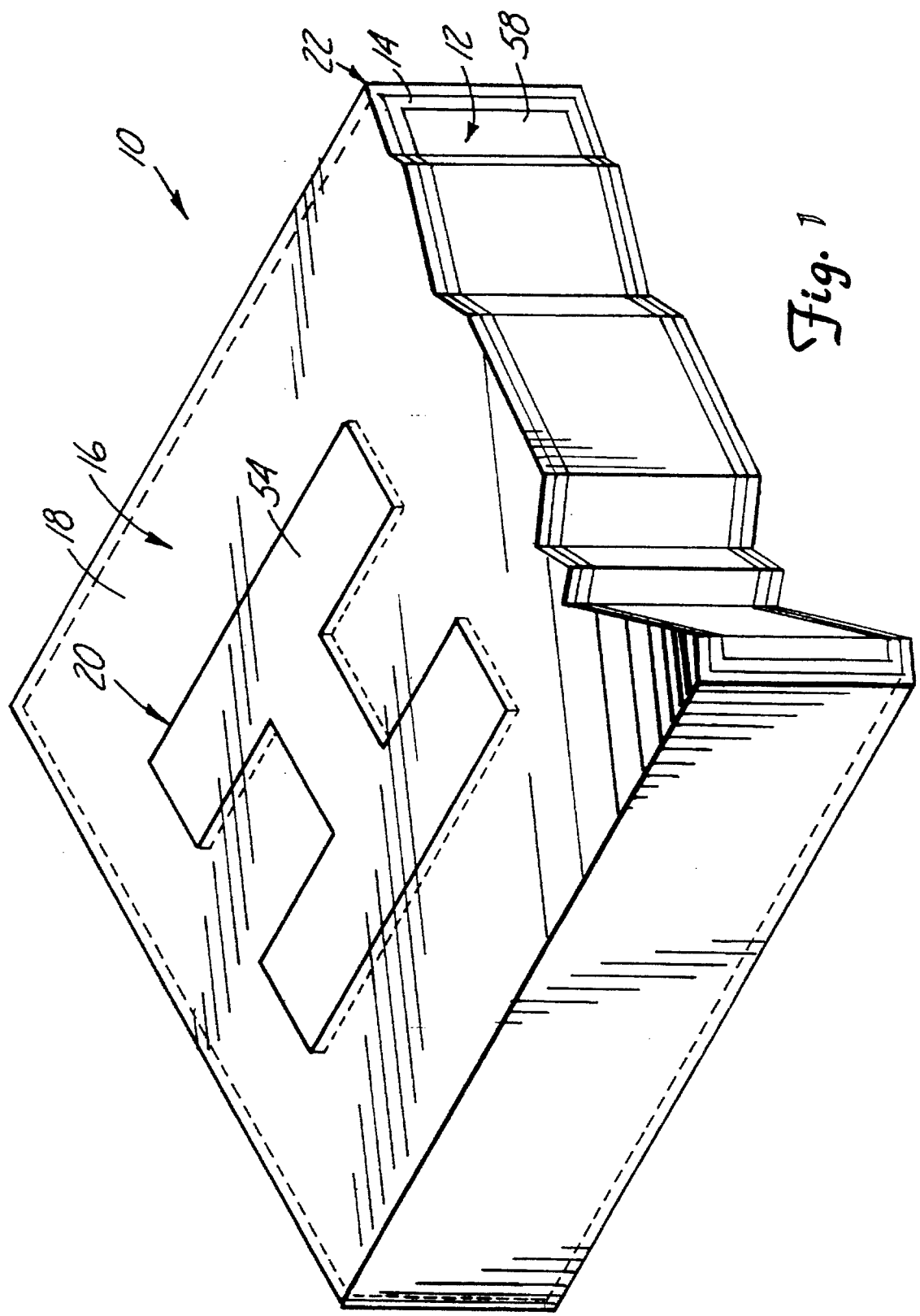
FIG. 1 is a perspective view of one embodiment of the article of the present invention.

A marked article produced in accordance with the method of the present invention is indicated generally at 10 in FIG. 1. The article 10 includes an alloyed area 20 that is positioned within a metal coating 16 of the article 10. The alloyed area 20 is created in a multi-step process pursuant to the present invention.

Figure 2:
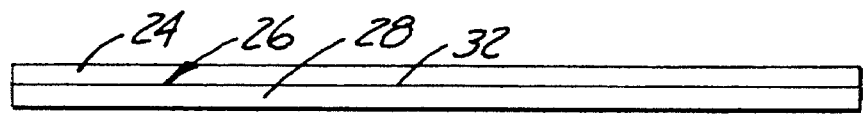
FIG. 2 is a layered diagram of one embodiment of an intermediate product of the method of the present invention.

The process of making the alloyed area 20, referring to FIG. 2, includes application of a patterning material, such as a layer of resist 24, to a carrier 26. Next, a guide shape (not shown) is created in the patterning material and metal is deposited within the guide shape, preferably by conventional electrolytic deposition techniques. The metal within the guide shape is alloyed with the metal coating 16 of the article 10 of FIG. 1 to form the alloyed area 20.

Throughout the drawings, like elements will be referred to using like reference characters.

The article 10 produced by a method of the invention may include a main body 12 and a cover, such as a lid 14, that encloses the main body 12. In one embodiment, the metal coating 16 is made of a base metal 18 and partially overlays the lid 14. The alloyed area 20 is associated with the lid 14 and is integral with the metal coating 16. Together, the metal coating 16 and the alloyed area 20 form a metallic coating 22 of the article 10.

Continuing with FIG. 2, the carrier 26 preferably takes the form of a sheet, such as a carrier layer 28. The carrier layer 28 is preferably capable of conducting electricity and is also flexible enough to closely conform to the metal coating 16 of FIG. 1. In one embodiment, the carrier layer 28 is made of stainless steel or aluminum that is preferably at least about 0.010 inches (250 micrometers) thick. In a more preferred embodiment, the carrier layer 28 is made of a flexible polymeric film, such as polyimide. The polyimide film is preferred over stainless steel and aluminum.

Stainless steel and aluminum, at thicknesses greater than about 0.010 inches (250 micrometers), tend to wrinkle easily during handling. Also, stainless steel and aluminum, at thicknesses greater than about 0.010 inches (250 micrometers), are not as flexible as the polyimide film and will not conform closely to the metal coating 16 when the metal coating 16 is other than substantially flat. One type of polyimide film is Kapton®, available from E. I. dupont de Nemours & Co. of Wilmington, Del.

When the carrier layer 28 is made of the polyimide film, the polyimide film is coated with chromium (not shown) and copper (not shown) to make the carrier layer 28 conductive. First, the chromium is sputter coated onto the polyimide film using a conventional technique. The copper is then sputter coated onto the chromium using a conventional technique. In one embodiment, the polyimide film is preferably about 0.001 inches (25 micrometers) thick, the chromium is, approximately 500 Angstroms thick, and the copper is approximately 2500 Angstroms thick.

Copper, a significantly better conductor than chromium, does not satisfactorily stick to some polymers, such as the polyimide film. Chromium satisfactorily bonds to the polyimide film and to the copper such that the copper is indirectly attached to the polyimide film to make the carrier layer 28 conductive.

In one embodiment, the resist 24 is applied only to an upper side 32 of the carrier layer 28. The resist 24 may be positive resist or negative resist. For purposes of this disclosure, positive resist is a type of resist in which a negative (not shown) of a particular image (not shown) is developed in the resist, and a positive (not shown) of the particular image remains undeveloped in the resist. Undeveloped resist within the positive of the particular image is removed and developed resist within the negative of the particular image remains for further use. For purposes of this disclosure, negative resist (not shown) is resist in which a positive (not shown) of the particular image is developed and a negative (not shown) of the particular image remains undeveloped. Developed resist within the positive of the particular image is removed and undeveloped resist within the negative of the particular image remains for further use.

In one embodiment, the resist 24 is conventional positive resist that is applied in liquid form by a conventional spin application technique at a thickness ranging between about 0.00075 inches (1.9 micrometers) and 0.002 inches (5 micrometers). The thickness of the positive resist may be controlled by adjusting the rate of spin upward or downward. It is generally desirable for the resist 24 to be thinner as geometric shapes (not shown) of the particular pattern become finer. Positive resist suitable for practicing the present invention is available from Hoescht Celanese Corporation of New York, N.Y.

Figure 3:
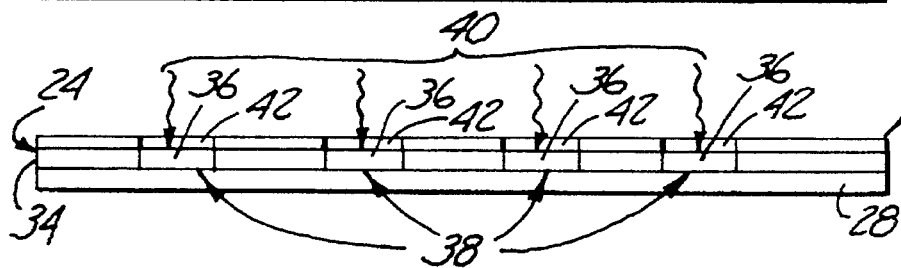
FIG. 3 is a layered diagram of another embodiment of an intermediate product of the method of the present invention.

In another embodiment, the resist 24 is preferably conventional negative resist 34, as in FIG. 3, applied in conventional fashion. Negative resist suitable for use as the negative resist 34 of the present invention is available from Hoescht Celanese Corporation of New York, N.Y. The negative resist 34 is preferably about 0.001 inches (25 micrometers) thick. Positive portions 36 in the shape of a desired image 38 are developed in the negative resist 34 using a conventional ultraviolet light source 40 that shines through windows 42 of a mask 44 that is placed proximate the negative resist 34. The windows 42 are optically transparent to wavelengths of ultraviolet light from the source 40 that desirably develop the positive portions 36 in the negative resist 34.

After the positive portions 36 are developed in the negative resist 34, the positive portions 36 are removed from the negative resist 34 by dipping the negative resist 34 and the carrier layer 28 in a first solvent bath (not shown). With the positive portions 36 removed, the negative resist 34 has recesses 46, as in FIG. 4, in place of the positive portions 36. Negative portions 37 of the negative resist 34 also remain after the positive portions 36 are removed.

The solvent selected for use in the first solvent bath and the duration of the solvent bath primarily depend upon the characteristics of the negative resist 34. The manufacturer of the negative resist 34 will typically suggest the composition and concentration of the solvent depending upon any of variety of variables including the applied thickness of the negative resist 34, and the composition of the negative resist 34, and the sizes of the positive portions 36. In one embodiment, the solvent used in the first bath is preferably potassium bicarbonate dissolved in water at a concentration of less than approximately 5.0% by volume.

Figure 4:
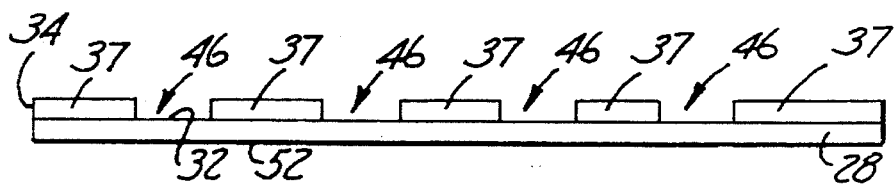
FIG. 4 is a layered diagram of another embodiment of an intermediate product of the method of the present invention.
Figure 5:
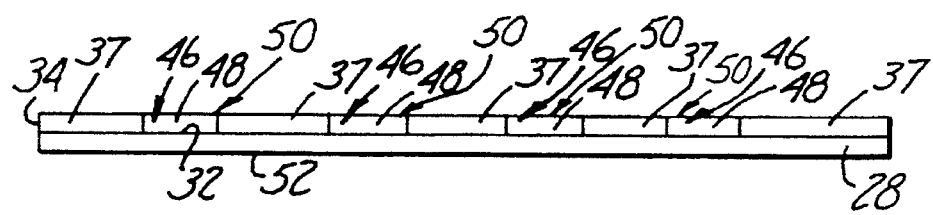
FIG. 5 is a layered diagram of another embodiment of an intermediate product of the method of the present invention.

After the positive portions 36 of FIG. 3 are removed to leave the recesses 46 of FIG. 4, the recesses 46 are plated with a metal component 48 to form a metal pattern 50, as in FIG. 5. The metal component 48 may be deposited on the carrier layer 28 by any of a variety of metal application techniques, though the metal component 48 is preferably applied using electrolytic deposition techniques.

In one embodiment, the carrier layer 28 and the negative resist 34 with the recesses 46, referring back to FIG. 4, are dipped into a plating tank (not shown) containing the metal component 48, preferably liquid metal in one embodiment. The liquid metal is plated onto the carrier layer 28 by application of current through the carrier layer 28 which is conductive, as already detailed. The current flowing through the carrier layer 28 induces the liquid metal to plate into the recesses 46 as depicted in FIG. 5. Though the metal component 48 is depicted in FIG. 5 as being plated to the full thickness of the recesses 46, the metal component 48 is not necessarily plated to the full thickness of the recesses 48 in other embodiments of the present invention.

Referring back to FIG. 4, the negative resist 34 and the metal component 48 are preferably selected such that the metal component 48 does not plate onto the negative portion 37 of the negative resist 34. Additionally, the metal component preferably does not plate onto a lower side 52 of the carrier layer 28 that is located opposite the upper side 32 of the carrier layer 28. When the carrier layer 28 is formed of conductive metal, such as aluminum or stainless steel, masking tape (not shown) such as a conventional plating tape (not shown) is applied to the lower side 52 of the carrier layer 28 to prevent the metal component 48 from plating onto the lower side 52. When the carrier layer 28 is made of the polyimide film with the chromium and copper coatings, there is no need to tape the lower side 52 of the carrier layer 28 since the metal component 48 will not plate directly onto the polyimide film.

In one embodiment, the metal component 48 that is plated onto the carrier layer 28 within the recess 46, as in FIG. 5, is solder. The solder of one embodiment is preferably made of about 63 percent tin and about 37 percent lead and is available from Alpha Metals, Inc. of Jersey City, N.J. For purposes of this disclosure only, solder made of about 63 percent tin and about 37 percent lead is referred to as tin-lead solder throughout the remainder of this disclosure. Of course, other composition and forms of the metal component 48, including other compositions of the solder, are understood to be within the scope of the present invention.

The depth to which the metal component 48 is plated within the recesses 46 onto the carrier layer 28 is controlled by adjusting several variables, including the duration of plating and the current that is applied to the carrier layer 28. In one preferred embodiment, the tin-lead solder is deposited within the recesses 46 to a thickness of between about 0.003 inches (75 micrometers) and 0.004 inches (100 micrometers).

After plating within the recesses 46 is complete, the negative portions 37 of the negative resist 34 are removed by dipping the negative portions 37 and the carrier layer 28 in a second solvent bath (not shown). The solvent selected for use in the second solvent bath and the duration of the second solvent bath primarily depend upon the characteristics of the negative resist 34. The manufacturer of the negative resist 34 will typically suggest the composition and concentration of the solvent depending upon any of a variety of variables including the thickness of the negative resist 34, the composition of the negative resist 34, and the sizes of the negative portions 37.

When the resist 24 is the negative resist 34, the solvent used in the second solvent bath is preferably potassium bicarbonate dissolved in water at a concentration of less than about 5.0% by volume. In another embodiment where the resist 24 is positive resist, the solvent of the second solvent bath is preferably potassium hydroxide dissolved in water at a concentration of approximately 5.0% by volume.

Figure 6:
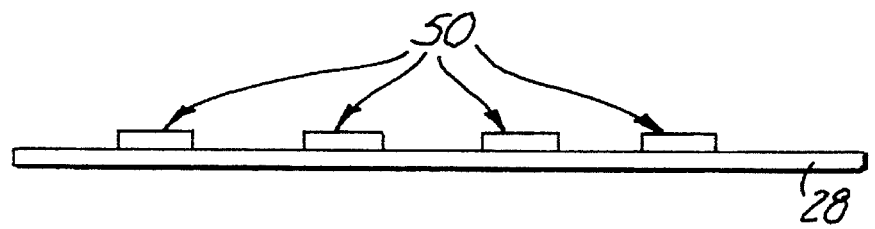
FIG. 6 is a layered diagram of another embodiment of an intermediate product of the method of the present invention.

After the negative portions 37 of the negative resist 34 are removed, as depicted in FIG. 6, the metal pattern 50 (not shown in FIG. 1) is alloyed with the metal coating 16 of FIG. 1 to create the alloyed area 20 of the metallic coating 22, as in FIG. 1. In one embodiment, the alloyed area 20 is preferably a mark 54 that discloses identifying information about the article 10. The mark 54 may denote a variety of information, such as the part number, the lot number, the manufacturer, and the date code of the article 10. The mark 54 may also have aesthetic value.

Figure 7:
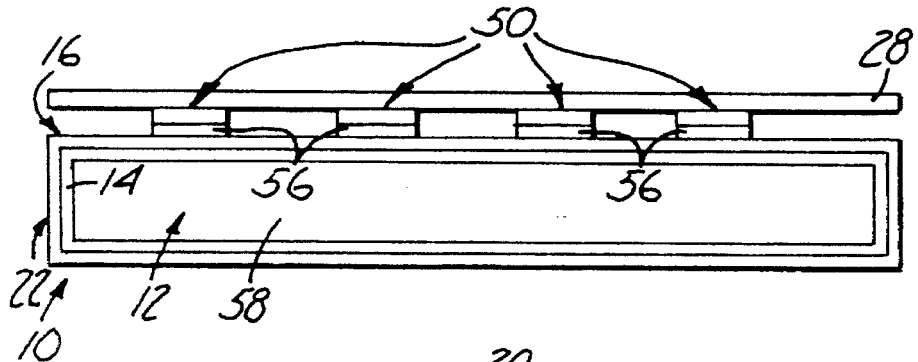
FIG. 7 is a layered diagram of another embodiment of an intermediate product of the method of the present invention.

To form the mark 54, referring to FIG. 7, a coating of flux 56 is placed on the metal coating 16 in the shape of the metal pattern 50. The metal pattern 50 is then placed against the flux 56 such that the metal pattern 50 is located between the carrier layer 28 and the metal coating 16. Heat is applied to alloy the metal pattern 50 and the metal coating 16 to form the alloyed area 20, preferably the mark 54, as in FIG. 8.

In one preferred embodiment, the main body 12 of the article 10 is a ceramic-based electronic component 58, such as an electronic circuit, circuit module, or chip. Preferably, the lid 14 is made of a metal alloy, such as Kovar® or Alloy 42®, that is comprised of iron, nickel, and cobalt. Kovar® is available from Carpenter Technology Corporation of Reading, Pa. Alloy 42® is available from Goodfellow Corporation of Malvern, Pa. The metal alloy is preferred for the lid 14 since the thermal coefficient of expansion of the metal alloy is substantially the same as the thermal coefficient of expansion of the ceramic used in the electronic component 58.

The substantial match of thermal coefficients of expansion for the metal alloy and for the ceramic of the component 58 minimizes or eliminates cracking of the ceramic in the component 58 due to thermal expansion or contraction of the: lid 14 relative to thermal expansion or contraction of the ceramic of the component 58. The lid 14, preferably made of Kovar® or Alloy 42®, is coated with the metal coating 16 to prevent oxidation of the metal alloy of the lid 14. Any of a variety of metals could be used to prevent the metal alloy from oxidizing, although gold has been found to best prevent the oxidation.

Placement of the flux 56 between the metal pattern 50 and the metal coating 16 is advisable if oxidation, such as corrosion, is present on either the metal coating 16 or the metal pattern 50. The flux 56 may be deleted under rare circumstances when neither the metal coating 16 nor the metal pattern 50 are oxidized. Caution about deleting the flux 56 is advisable since, absent the flux 56, any oxidation in the metal coating 16 or the pattern 50 may inhibit alloying of the pattern 50 and the metal coating 16 create undesirable characteristics in the mark 54.

Several formulations of the flux 56 are available. For example, the flux 56 may have a rosin base or an aqueous base. These types of fluxes are typically available as a paste which is applied to the metal coating 16. Rosin-based flux and aqueous-based flux are each available from Alpha Metals, Inc. of Jersey City, N.J. Another type of flux 56, No Clean® flux, is applied by spraying a thin layer of the flux 56 onto the metal coating 16. No Clean® flux is also available from Alpha Metals, Inc. of Jersey City, N.J. No Clean® flux does not have to be cleaned from the metallic coating 22 after formation of the mark 54.

Figure 8:
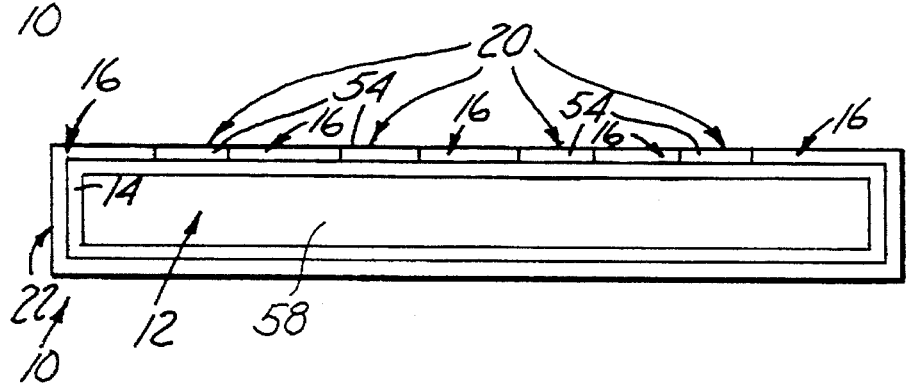
FIG. 8 is a layered diagram of one embodiment of the article of the present invention.

Heat may be applied to the metal pattern 50 and the metal coating 16 of FIG. 7 in a variety of ways to form the alloyed area 20 of FIG. 8. For example, heat may be applied using an infrared source (not shown); a direct heat source (not shown), such as an oven, a hot plate, or a hot bar; or by a vapor phase heat oven (not shown).

The infrared source is less preferred because the process temperature during heating may fluctuate, depending upon the color of the article 10. Darker colored objects absorb more infrared heat and tend to become hotter than lighter colored objects. Control of alloying of the metal coating 16 and the metal pattern 50 is more difficult when heating depends upon the color of the article 10, in addition to the level of energy input to the infrared source.

Direct heating of the metal pattern 50 and the metal coating 16 using the direct heat source (not shown) is also less preferred. For example, varying placement of the direct heat source relative to the metal coating 16 and the pattern 50 may create temperature variations and control problems in the alloying process. Also, varying geometries and spatial relationships of the metal coating 16 and the metal pattern 50 may also create temperature variations and control problems in the alloying process.

Preferably, the heat is supplied by the vapor phase heat oven (not shown). The metal pattern 50, the carrier layer 28, and the article 10 are placed within the vapor phase heat oven. A select chemical, such as a fluorocarbon known as FC70®, is vaporized by heating. The vapor of the FC70® is circulated through the vapor phase heat oven after the vapor is heated to a sufficient temperature to alloy the metal pattern 50, preferably made of the tin-lead solder, and the metal coating 16, preferably made of gold. Air is prevented from entering the oven and causing oxidation of the metal pattern 50 and the metal coating 16 during the alloying process. FC70® has a fixed boiling point that enables a constant temperature to be maintained within the vapor phase heat oven once the FC70® vaporizes. Preferably, the vapor of FC70® is heated to and maintained at a temperature of approximately 220° C. FC70® is available from Minnesota Mining and Manufacturing of St. Paul, Minn.

After the mark 54 is formed and the article 10 is removed from the heat source, preferably the vapor phase oven, the carrier layer 28 is removed from the mark 54 and the article 10, as illustrated in FIG. 8. It has been observed that the polyimide film coated with chromium and copper negligibly adheres to the metal coating 16 made of gold and detaches easily from the mark 54 with light digital pressure.

Any flux 56 that is applied, as depicted in FIG. 7 is removed from the metallic coating 22 after the carrier layer 28 is removed. Generally the flux 56 is cleaned using a rag lightly soaked in an appropriate cleaning solvent. Water is the cleaning solvent if the flux is aqueous-based, and alcohol or a chlorinated solvent is the cleaning solvent if the flux is rosin-based. Preferably, the flux 56 is applied and the metal coating 16 and the metal pattern 50 are alloyed within a period of less than about 1 hour. Otherwise, it has been found that the flux 56 may be difficult to remove after alloying is complete. If the flux 56 is No Clean® flux, the flux 56 need not generally be cleaned from the metallic coating 22.

It has been found that the alloyed area 20, such as the mark 54, and the metal coating 16 form a substantially flat, substantially smooth outer surface 60 of the article 10, as in FIG. 8. The metal pattern 50, preferably comprised of the alloy of tin, lead, and gold, is preferably not elevated or depressed relative of the metal coating 16 when observed by a person's unaided eye. Additionally, the mark 54 and the metal coating 16 preferably contrast in color such that the mark 54 is visually distinguishable from the metal coating 16. In one preferred embodiment, the mark 54 made of the tin, lead, and gold alloy is darker in appearance than the gold of the metal coating 16.

Although the present invention has been described with reference to preferred embodiments, workers skilled in the art will recognize that changes may be made in form and detail without departing from the spirit and scope of the invention.

What is claimed is:

1. An article having a mark, the article comprising a metallic coating with a first portion and a second portion, the mark comprising an alloy of a first metal component and a second metal component, the first portion of the metallic coating comprising the first metal component and the second portion of the metallic coating comprising the alloy, the article further comprising a conductive carrier layer removably attached to the mark.

2. The article of claim 1 wherein the alloy of the first metal component and the second metal component is formed by soldering the second metal component to the first metal component.

3. The article of claim 1 wherein the first metal component substantially comprises gold.

4. The article of claim 1 wherein the second metal component comprises solder.

* * * * *